(12) United States Patent
Kawasumi

(10) Patent No.: US 9,384,852 B1
(45) Date of Patent: Jul. 5, 2016

(54) SEMICONDUCTOR DEVICE

(71) Applicant: KABUSHIKI KAISHA TOSHIBA, Tokyo (JP)

(72) Inventor: Atsushi Kawasumi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/836,868

(22) Filed: Aug. 26, 2015

(30) Foreign Application Priority Data

Mar. 12, 2015 (JP) .................................. 2015-049260

(51) Int. Cl.
*G11C 17/00* (2006.01)
*G11C 17/18* (2006.01)
*G11C 17/16* (2006.01)
*H01L 27/22* (2006.01)
*H01L 27/112* (2006.01)
*G11C 29/00* (2006.01)

(52) U.S. Cl.
CPC ............... *G11C 17/18* (2013.01); *G11C 17/00* (2013.01); *G11C 17/16* (2013.01); *G11C 29/82* (2013.01); *H01L 27/112* (2013.01); *H01L 27/11206* (2013.01); *H01L 27/224* (2013.01)

(58) Field of Classification Search
CPC ........ G11C 17/18; G11C 17/16; G11C 29/82; G11C 17/00; H01L 27/11206; H01L 27/224; H01L 27/112
USPC .......... 365/63, 94, 96, 103, 104, 105, 189.011
See application file for complete search history.

(56) References Cited

U.S. PATENT DOCUMENTS

| 2006/0244099 A1 | 11/2006 | Kurjanowicz |
| 2007/0217246 A1* | 9/2007 | Kurata ................. G11C 7/12 365/94 |
| 2008/0198643 A1* | 8/2008 | Shin ..................... G11C 17/18 365/96 |

FOREIGN PATENT DOCUMENTS

| JP | 2005183533 A | 7/2005 |
| JP | 2005195746 A | 7/2005 |

OTHER PUBLICATIONS

Shen, et al., "A High-Density Logic CMOS Process Compatible Non-Volatile Memory for Sub-28nm Technologies", 2014 Symposium on VLSI Technology Digest of Technical Papers, 2014 IEEE, pp. 1-2.

* cited by examiner

*Primary Examiner* — Fernando Hidalgo
(74) *Attorney, Agent, or Firm* — Patterson & Sheridan, LLP

(57) ABSTRACT

A semiconductor device which includes a normal cell, a replica cell, a word line, a first bit line, a bias generation circuit, a second bit line, and a current generation circuit. The normal cell is a one-time programmable (OTP) type memory cell. The replica cell has characteristics equivalent to those of the normal cell. The word line is electrically connected in common to a control terminal of the normal cell and a control terminal of the replica cell. The first bit line is electrically connected to an input-output terminal of the replica cell. The bias generation circuit is electrically connected to the first bit line. The second bit line is electrically connected to an input-output terminal of the normal cell. The current generation circuit is electrically connected to the second bit line. The bias generation circuit and the current generation circuit are controlled through a common control line.

20 Claims, 10 Drawing Sheets

SEMICONDUCTOR DEVICE

CROSS-REFERENCE TO RELATED APPLICATION

This application is based upon and claims the benefit of priority from Japanese Patent Application No. 2015-049260, filed Mar. 12, 2015, the entire contents of which are incorporated herein by reference.

FIELD

An embodiment described herein relates generally to a semiconductor device.

BACKGROUND

In a semiconductor device including a one-time programmable (OTP) type memory cell, predetermined information is programmed in the memory cell during an inspection process before the shipment of the memory cell. In addition, the memory cell is inspected with regard to whether programming has been properly performed therein. It would be desirable to reduce the inspection time as much as possible.

DETAILED DESCRIPTION

Embodiments provide a semiconductor device which is suitable for a reduction in an inspection time for a memory cell.

In general, according to one embodiment, a semiconductor device includes a normal cell, a replica cell, a word line, a first bit line, a bias generation circuit, a second bit line, and a current generation circuit. The normal cell is a one-time programmable (OTP) type memory cell. The replica cell has characteristics equivalent to those of the normal cell. The word line is electrically connected in common to a control terminal of the normal cell and a control terminal of the replica cell. The first bit line is electrically connected to an input-output terminal of the replica cell. The bias generation circuit is electrically connected to the first bit line. The second bit line is electrically connected to an input-output terminal of the normal cell. The current generation circuit is electrically connected to the second bit line. The bias generation circuit and the current generation circuit are controlled through a common control line.

Hereinafter, a semiconductor device according to an embodiment is described in detail with reference to the accompanying drawings. The example embodiment described herein is not limited by the embodiment.

Embodiment

Figure 1:
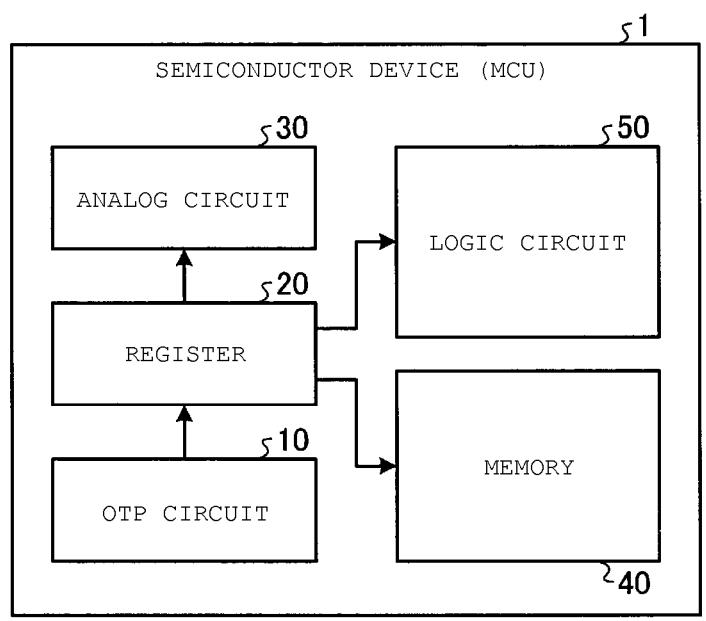
FIG. 1 is a block diagram illustrating the configuration of a semiconductor device according to an embodiment.

A semiconductor device 1 according to an embodiment is described with reference to FIG. 1, which is a block diagram illustrating the configuration of the semiconductor device 1.

The semiconductor device 1, which is, for example, a microcomputer (MCU), includes a one-time programmable (OTP) circuit 10, a register 20, an analog circuit 30, a memory 40, and a logic circuit 50. The OTP circuit 10 is configured to be non-erasable, so that data written in the OTP circuit 10 cannot be erased. Operation parameters for the analog circuit 30, the memory 40, and the logic circuit 50 are stored in the OTP circuit 10 in advance before the shipment thereof.

For example, a plurality of memory cells and a plurality of redundant cells in the memory 40 are arranged in an array. Redundancy replacement information regarding which memory cell in the memory 40 is replaced with a redundant cell is stored in the OTP circuit 10. In addition, ID information inherent in a chip, pieces of tuning information of the analog circuit 30 and the logic circuit 50, and the like are stored in the OTP circuit 10.

The semiconductor device 1 includes a power supply circuit (not shown). When the power supply circuit is started up, the semiconductor device reads out an operation parameter stored in the OTP circuit 10, transmits the operation parameter to the register 20, which stores the operation parameter. Thereby, the operation parameter is made usable by the analog circuit 30, the memory 40, and the logic circuit 50. The analog circuit 30, the memory 40, and the logic circuit 50 acquire the operation parameter from the register 20 and use the operation parameter for the operation thereof when necessary.

For this reason, data of the operation parameter is written in selected memory cells in the OTP circuit 10 including a plurality of one time programmable (OTP) type memory cells before the shipment of the semiconductor device 1.

Conventionally, loop processing involving alternately repeating writing operations and verifying operations, is performed while increasing a program voltage until it is determined (verified) that writing has succeeded, in order to ensure that data has been properly programmed in the memory cell. In this case, when the number of loops increases, there is a tendency for an inspection time for the memory cell regarding whether or not the programming is being properly performed to be lengthened.

In the embodiment, in the semiconductor device 1, the programming of the memory cell is inspected without performing loop processing by generating a bias using a replica cell having characteristics equivalent to those of an OTP type memory cell (normal cell) and by determining the success or failure of the programming using a reference current based on the generated bias.

Figure 2:
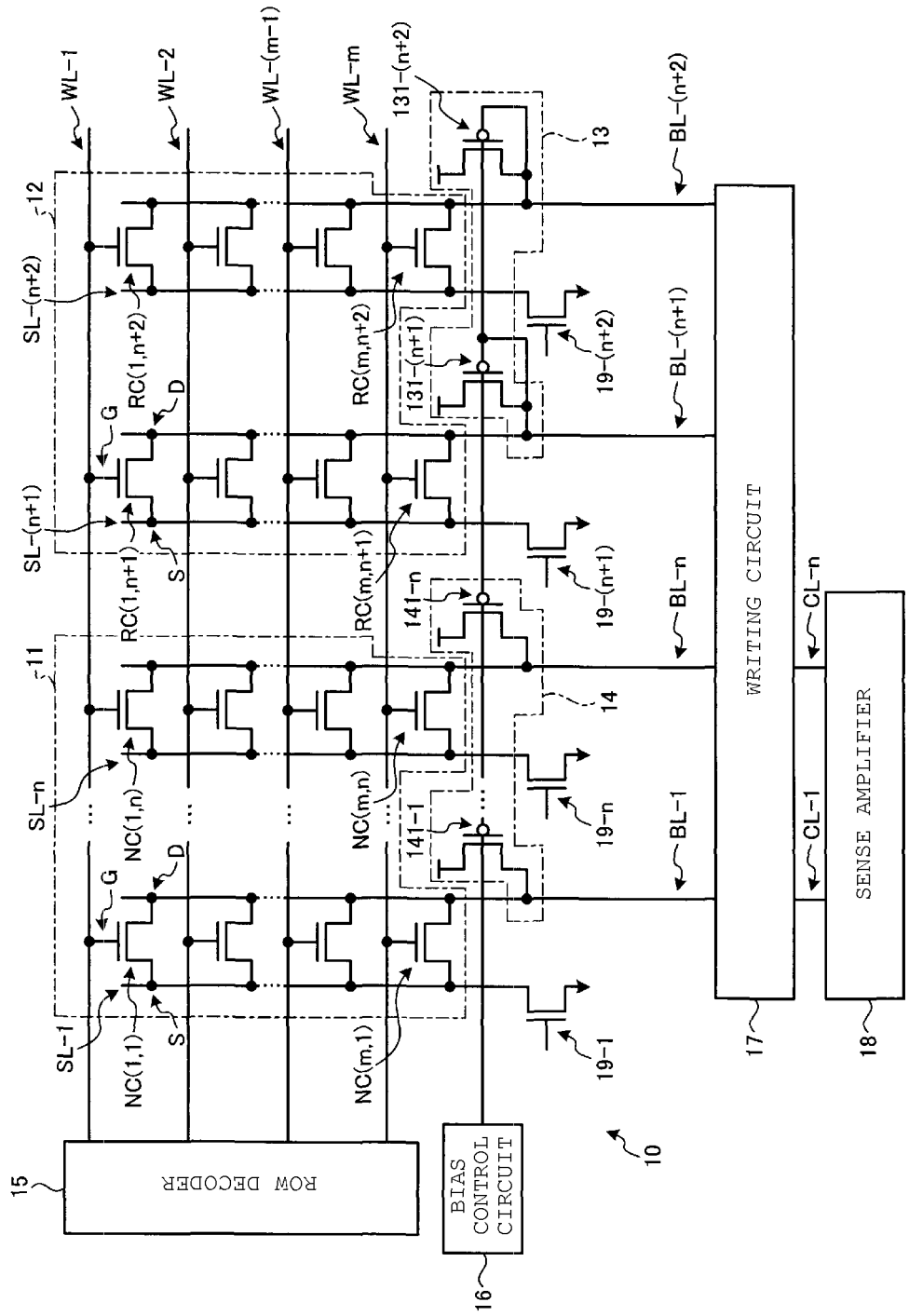
FIG. 2 is a circuit diagram illustrating the configuration of an OTP circuit in the embodiment.

Specifically, the OTP circuit 10 has the configuration illustrated in FIG. 2, which is a circuit diagram illustrating the OTP circuit 10. The OTP circuit 10 includes a normal cell array 11, a replica cell array 12, a plurality of word lines WL-1 to WL-m, a plurality of source lines SL-1 to SL-(n+2), a plurality of bit lines BL-1 to BL-(n+2), a bias generation circuit 13, a current generation circuit 14, a row decoder 15, a bias control circuit 16, a writing circuit 17, and a sense amplifier 18.

In the normal cell array 11, a plurality of normal cells NC(1,1) to NC(m,n) are arranged in a two-dimensionally array having a plurality of rows (m rows) and a plurality of columns (n columns). Here, m and n are integers equal to or greater than 2. For example, m=8 and n=512. Each normal cell NC is an OTP type memory cell, in which data written once is not erased. Each normal cell NC, which is, for example, an NMOS transistor, is able to store one bit of data by accumulating electrons in a gate oxide film.

The plurality of rows of normal cells NC correspond to the plurality of word lines WL-1 to WL-m. A control terminal G of the normal cell NC in each row is electrically connected to the corresponding word line WL. The control terminal G of the normal cell NC in each row is, for example, a gate of an NMOS transistor.

The plurality of columns of normal cells NC corresponds to the plurality of source lines SL-1 to SL-n. A reference terminal S of the normal cell NC in each column is electrically connected to the corresponding source line SL. The reference terminal S of the normal cell NC in each column is, for example, a source or a drain of an NMOS transistor.

The plurality of columns of normal cells NC also corresponds to the plurality of bit lines BL-1 to BL-n. An input-output terminal D of the normal cell NC in each column is electrically connected to the corresponding bit line BL. The input-output terminal D of the normal cell NC in each column is, for example, a drain or source of an NMOS transistor.

In the replica cell array 12, a plurality of replica cells RC(1,$n$+1) to RC(m,n+2) are two-dimensionally arrayed into a plurality of rows (m rows) and a plurality of columns (two columns). Each replica cell RC is configured to have electrical characteristics equivalent to those of the normal cell NC. For example, when the normal cell NC is an NMOS transistor, each replica cell RC is an NMOS transistor having dimensions (=W/L, W: channel width, L: channel length) which are equivalent to that of the normal cell NC.

The plurality of rows of replica cells RC corresponds to the plurality of word lines WL-1 to WL-m. The control terminal G of the normal cell NC in each row is electrically connected to the corresponding word line WL. The control terminal G of the replica cell RC in each row is, for example, a gate of an NMOS transistor.

The plurality of columns of replica cells RC corresponds to a plurality of source lines SL-(n+1) and SL-(n+2). The reference terminal S of the replica cell RC in each column is electrically connected to the corresponding source line SL. The reference terminal S of the replica cell RC in each column is, for example, a source or a drain of an NMOS transistor.

The plurality of columns of replica cells also corresponds to a plurality of bit lines BL-(n+1) and BL-(n+2). The input-output terminal D of the replica cell RC in each column is electrically connected to the corresponding bit line BL. The input-output terminal D of the replica cell RC in each column is, for example, a drain or source of an NMOS transistor.

Current sources 19-1 to 19-($n$+2) are inserted into the respective source lines SL-1 to SL-(n+2). The current sources 19-1 to 19-($n$+2) are controlled by, for example, the writing circuit 17, operate during a read-out operation from the normal cells NC, and pull potentials of the source lines SL-1 to SL-(n+2) to a ground potential. The current sources 19-1 to 19-($n$+2) are, for example, NMOS transistors in each of which the gate is connected to the writing circuit 17, the source is connected to the ground potential, and the drain is connected to the source line SL.

The bias generation circuit 13 generates a bias based on a current flowing through the bit line BL-(n+1) and a current flowing through the bit line BL-(n+2) during a read-out operation from the normal cell NC. The bias generation circuit 13 generates the bias by averaging a current flowing through the bit line BL-(n+1) and a current flowing through the bit line BL-(n+2). That is, the bias generation circuit 13 generates a bias corresponding to average characteristics (averaged threshold characteristics) which are obtained by averaging threshold characteristics of the replica cell RC in an (n+1)-th column and threshold characteristics of the replica cell RC in an (n+2)-th column. The bias generation circuit 13 supplies the generated bias to the current generation circuit 14. The current generation circuit 14 generates a reference current based on the bias generated by the bias generation circuit 13 and supplies the reference current to each of the bit lines BL-1 to BL-n during a read-out operation from the normal cell NC.

For example, the bias generation circuit 13 includes a plurality of bias transistors 131-($n$+1) and 131-($n$+2) corresponding to the plurality of bit lines BL-(n+1) and BL-(n+2). The current generation circuit 14 includes a plurality of current source transistors 141-1 to 141-$n$ corresponding to the plurality of bit lines BL-1 to BL-n. The bias transistors 131-($n$+1) and 131-($n$+2) and the respective current source transistors 141-1 to 141-$n$ form a current mirror circuit, which causes the reference current obtained by averaging a current flowing through the bit line BL-(n+1) and a current flowing through the bit line BL-(n+2) to be copied into each of the bit lines BL-1 to BL-n at a predetermined mirror ratio. For example, when the dimensions of the respective bias transistors 131-($n$+1) and 131-($n$+2) are equal to the dimensions of the respective current source transistors 141-1 to 141-$n$, the mirror ratio is approximately 1, and a reference current which is substantially equal to the reference current averaged by the bias generation circuit 13 is copied into the bit lines BL-1 to BL-n.

The row decoder 15 is electrically connected to the plurality of word lines WL-1 to WL-m. The row decoder 15 controls voltages of the respective word lines WL-1 to WL-m, and a voltage which is applied to the control terminal G of the normal cell NC in each row and the control terminal G of the replica cell RC in each row. For example, in a programming operation for the normal cell NC, the row decoder 15 applies a program voltage Vwp (for example, 8 V) to the word line WL in a selection row, and applies a non-selection voltage Vwu (for example, 0 V) to the word line WL of a non-selection row. In a read-out operation from the normal cell NC, the row decoder 15 applies a read-out voltage Vwr (for example, 1 V) to the word line WL in a selection row, and applies a non-selection voltage Vwu (for example, 0 V) to the word line WL of a non-selection row.

The bias control circuit 16 controls the operation of the current source transistors 141-1 to 141-$n$ and the bias transistors 131-($n$+1) and 131-($n$+2). For example, the bias control circuit 16 supplies a reference bias of an OFF-level to gates of the current source transistors 141-1 to 141-$n$ and the bias transistors 131-($n$+1) and 131-($n$+2) in a programming operation for the normal cell NC, so as to turn off the current source transistors 141-1 to 141-$n$ and the bias transistors 131-($n$+1) and 131-($n$+2). The bias control circuit 16 supplies a reference bias of an ON-level to the gates of the current source transistors 141-1 to 141-$n$ and the bias transistors 131-($n$+1)

and 131-(n+2) in a read-out operation from the normal cell NC, so as to turn on the current source transistors 141-1 to 141-n and the bias transistors 131-(n+1) and 131-(n+2).

The writing circuit 17 is electrically connected to the plurality of bit lines BL-1 to BL-(n+2). The writing circuit 17 controls voltages of the respective bit lines BL-1 to BL-(n+2). The writing circuit 17 supplies a selection voltage Vbp to the bit line BL in a selection row (row which is a target for programming), among the bit lines BL-1 to BL-n, in the programming operation for the normal cell NC, and supplies a non-selection voltage Vbu to the bit line BL of a non-selection row. In addition, the writing circuit 17 supplies the selection voltage Vbp to one of the bit lines BL-(n+1) and BL-(n+2), and supplies the non-selection voltage Vbu to the other bit line. The writing circuit 17 stops controlling the voltages of the respective bit lines BL-1 to BL-(n+2) in the read-out operation from the normal cell NC.

The writing circuit 17 controls connection between the bit lines BL-1 to BL-n and connection lines CL-1 to CL-n. The plurality of bit lines BL-1 to BL-n and the plurality of connection lines CL-1 to CL-n correspond to each other. The writing circuit 17 blocks connection between the bit lines BL-1 to BL-n and the connection lines CL-1 to CL-n which correspond to each other, in the programming operation for the normal cell NC. The writing circuit 17 connects the bit lines BL-1 to BL-n and the connection lines CL-1 to CL-n which correspond to each other, in the read-out operation from the normal cell NC.

The writing circuit 17 connects to control terminals (for example, gates of NMOS transistors) of the current sources 19-1 to 19-(n+2). The writing circuit 17 controls the operations of the current sources 19-1 to 19-(n+2). The writing circuit 17 turns off the current sources 19-1 to 19-(n+2) in the programming operation for the normal cell NC and turns on the current sources 19-1 to 19-(n+2) in the read-out operation from the normal cell NC.

The sense amplifier 18 can be electrically connected to the plurality of bit lines BL-1 to BL-n through the plurality of connection lines CL-1 to CL-n and the writing circuit 17. The sense amplifier 18 is electrically disconnected from the bit lines BL-(n+1) and BL-(n+2) corresponding to the replica cell RC. The sense amplifier 18 is electrically blocked from the plurality of bit lines BL-1 to BL-n through the writing circuit 17 in the programming operation for the normal cell NC. The sense amplifier 18 is electrically connected to the plurality of bit lines BL-1 to BL-n through the plurality of connection lines CL-1 to CL-n and the writing circuit 17 in the read-out operation from the normal cell NC. Thus, the sense amplifier 18 detects the potentials of the respective bit lines BL-1 to BL-n. For example, the sense amplifier 18 detects the potentials of the respective bit lines BL-1 to BL-n after a reference current is supplied to the bit lines BL-1 to BL-n for a predetermined period of time, and supplies a detection result to an external controller (not shown). As a result, the external controller can compare the detected potentials of the respective bit lines BL-1 to BL-n with a reference potential, and inspect whether or not data is properly programmed in the normal cell NC, which is a target for read-out, in a selection row in accordance with a comparison result.

The normal cells NC and the replica cells RC may be a transistor having a thick gate oxide film for improved reliability, and a transistor configuring the writing circuit 17 and the sense amplifier 18 may be a transistor having a thin gate oxide film in order to reduce the area thereof. For this reason, it is preferable that a difference between the selection voltage Vbp and the non-selection voltage Vbu, which are applied to the bit lines BL-1 to BL-n by the writing circuit 17, be set to be approximately 1V.

Figure 3:
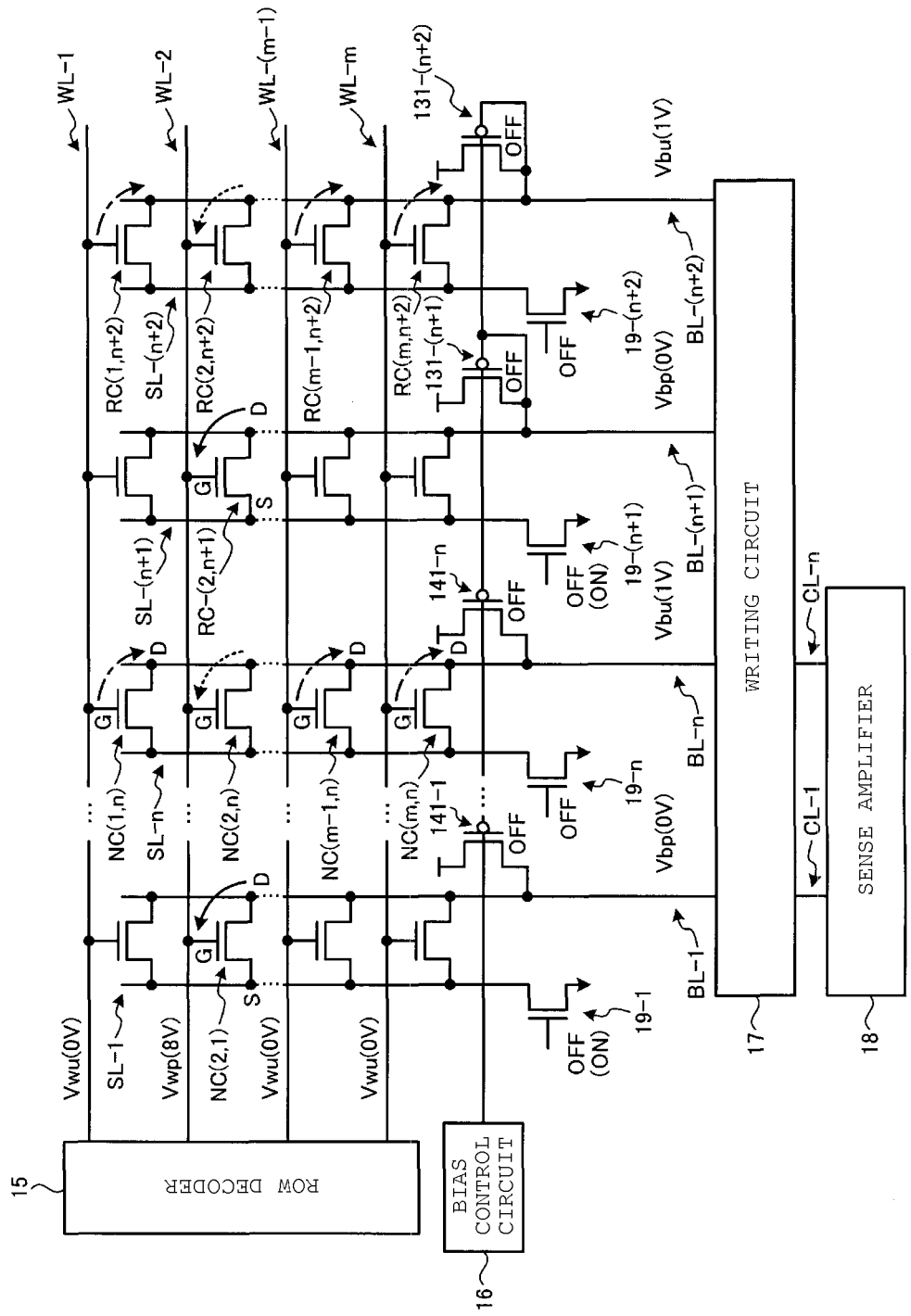
FIG. 3 is a circuit diagram illustrating a programming operation for a normal cell in the embodiment.
Figure 4:
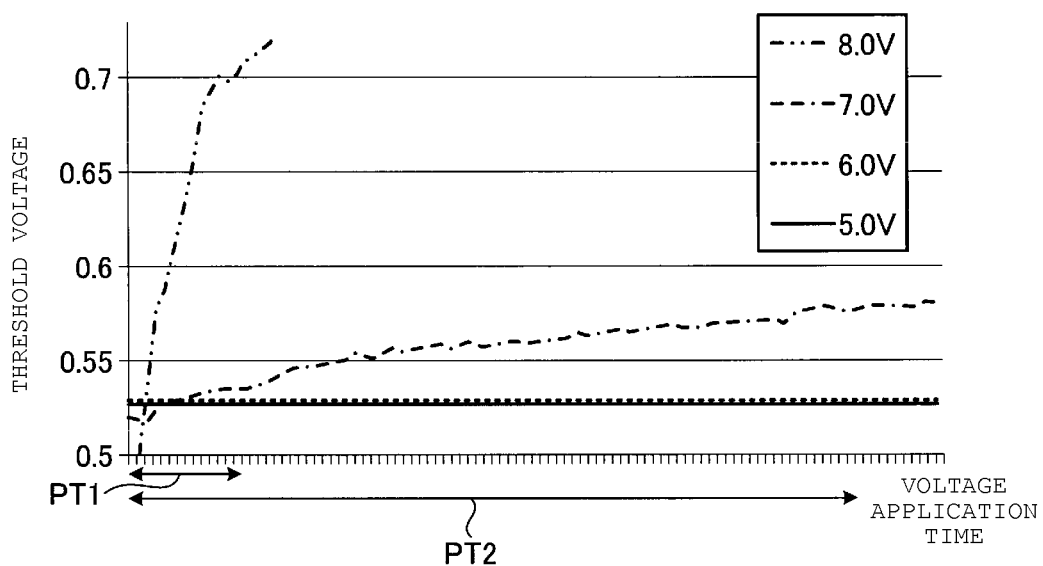
FIG. 4 is a graph illustrating program characteristics of a normal cell in the embodiment.

Next, a programming operation for the normal cell NC in the OTP circuit 10 is described with reference to FIGS. 3 and 4. FIG. 3 is a circuit diagram illustrating a programming operation for the normal cell NC. FIG. 4 is a graph illustrating program characteristics of the normal cell NC. In FIG. 4, program characteristics of the normal cell NC in the cases where a voltage between a gate, a source, and a drain is 5.0 V, 6.0 V, 7.0 V, and 8.0 V are shown by a solid line, a dotted line, a dashed line, and a two-dot chain line, respectively.

In the programming operation for the normal cell NC, the bias control circuit 16 turns off the current source transistors 141-1 to 141-n and the bias transistors 131-(n+1) and 131-(n+2) as illustrated in FIG. 3. Thus, the bit lines BL-1 to BL-(n+2) are not driven by the current source transistors 141-1 to 141-n, which results in a state where the voltages thereof can be changed easily. In addition, the writing circuit 17 blocks connection between the bit lines BL-1 to BL-n and the corresponding connection lines CL-1 to CL-n and turns off the current sources 19-1 to 19-(n+2). Thus, the source lines SL-1 to SL-(n+2) are left in a floating state.

To program a bit "1" in the normal cell NC(2,1) in the second row and first column and in the other normal cells NC, the row decoder 15 applies a program voltage Vwp (for example, 8 V) to a word line WL-2 in the selection row (second row), and applies a non-selection voltage Vwu (for example, 0 V) to word lines WL-1 and WL-3 to WL-m of non-selection rows (first and third to m-th rows). In addition, the writing circuit 17 supplies a selection voltage Vbp (for example, 0 V) to bit lines BL-1 and BL-(n+1) in the first and (n+1)-th columns, and supplies a non-selection voltage Vbu (for example, 1 V) to bit lines BL-2 to BL-n and BL-(n+2) in the other second to n-th and (n+2)-th columns.

In the selection row (second row), the normal cell NC(2,1) targeted for programming is turned on, and thus both a reference terminal S and an input-output terminal D have the selection voltage Vbp (for example, 0 V). Electrons are drawn toward a gate oxide film side due to a voltage difference between a program voltage Vwp (8 V) and a selection voltage Vbp (for example, 0 V) which are applied between the control terminal G and the D terminal. As illustrated in FIG. 4, when an application time of the program voltage Vwp is PT1, electrons are accumulated in the gate oxide film in the normal cell NC(2,1) in which a difference in voltage between the control terminal G and the input-output terminal D is approximately 8 V, and a threshold voltage changes from approximately 0.5 V to approximately 0.7 V.

In the selection row (second row) illustrated in FIG. 3, the normal cells NC(2,2) to NC(2,n) which are targets for non-programming are turned on, and thus both the reference terminal S and the input-output terminal D have a non-selection voltage Vbu (for example, 1 V). Electrons are drawn toward the gate oxide film side due to a voltage difference between the program voltage Vwp (8 V) and the non-selection voltage Vbu (for example, 1 V) which are applied between the control terminal G and the D terminal. As illustrated in FIG. 4, in the other normal cells NC(2,2) to NC(2,n) in which a difference in voltage between the control terminal G and the input-output terminal D is approximately 7 V, electrons are not accumulated in the gate oxide film, and a threshold voltage is little changed staying at approximately 0.5 V.

Thereby, in the selection row (second row), it is possible to make a threshold voltage different between the normal cell NC(2,1) and the other normal cells NC(2,2) to NC(2,n). That is, it is possible to set the normal cell NC(2,1) to be in a program state (see a solid line arrow of FIG. 3) and to set the other normal cells NC(2,2) to NC(2,n) to remain in a non-program state (see a dotted line arrow of FIG. 3).

At this time, since a replica cell RC(2,n+1) is turned on, both the reference terminal S and the input-output terminal D have a selection voltage Vbp (for example, 0 V). Electrons are drawn toward the gate oxide film side due to a voltage difference between a program voltage Vwp (8 V) and a selection voltage Vbp (for example, 0 V) which are applied between the control terminal G and the D terminal. At this time, as illustrated in FIG. 4, when an application time of the program voltage Vwp is PT1, electrons are accumulated in the gate oxide film in the replica cell RC(2,n+1) in which a difference in voltage between the control terminal G and the input-output terminal D is approximately 8 V, and a threshold voltage changes from approximately 0.5 V to approximately 0.7 V. That is, the replica cell RC(2,n+1) replicates the program state of the normal cell NC(2,1).

Since the replica cell RC(2,n+2) is turned on, both the reference terminal S and the input-output terminal D have a non-selection voltage Vbu (for example, 1 V). Electrons are drawn toward the gate oxide film side due to a voltage difference between a program voltage Vwp (8 V) and a non-selection voltage Vbu (for example, 1 V) which are applied to the control terminal G. As illustrated in FIG. 4, in the replica cell RC(2,n+2) in which a difference in voltage between the control terminal G and the input-output terminal D is approximately 7 V, electrons are not accumulated in the gate oxide film, and a threshold voltage stays approximately at 0.5 V. That is, the replica cell RC(2,n+2) replicates the non-program state of the normal cells NC(2,2) to NC(2,n).

On the other hand, in non-selection rows (first and third to m-th rows), all of the normal cells NC are turned off. In normal cells NC(1,2) to NC(1,n), normal cells NC(2,2) to NC(2,n), . . . , and normal cells NC(m,2) to NC(m,n) in the non-selection rows (first and third to m-th rows) and non-selection columns (second to n-th columns), a non-selection voltage Vwu (0 V) is applied to control terminals G, and a non-selection voltage Vbu (1 V) is applied to input-output terminals D. This causes, in normal cells NC in the non-selection rows (first and third to m-th rows) and the non-selection columns (second to n-th columns), a reverse bias to be applied between the control terminal G and the input-output terminal D, and thus there is a possibility that program disturbance occurs (see a dashed line arrow of FIG. 3) where electrons escape from a gate insulating film when the cell is in a programmed state. When the program disturbance occurs, threshold characteristics of the normal cells NC vary.

At this time, in replica cells RC(1,n+2) and RC(3,n+2) to RC(m,n+2) in the non-selection rows (first and third to m-th rows) and an (n+2)-th column, all of the replica cells are turned off. A non-selection voltage Vwu (0 V) is applied to control terminals G, and a non-selection voltage Vbu (1 V) is applied to input-output terminals D. Thus, in the replica cells RC in the non-selection rows (first and third to m-th rows) and the (n+2)-th column, a reverse bias is applied between the control terminal G and the input-output terminal D, and thus there is a possibility that program disturbance occurs (see the dashed line arrow of FIG. 3) where electrons escape from the gate insulating film when the cell is in a programmed state. That is, the replica cells RC(1,n+2) and RC(3,n+2) to RC(m,n+2) replicate the program disturbance of the normal cells NC in the non-selection rows (first and third to m-th rows) and the non-selection columns (second to n-th columns).

Figure 5:
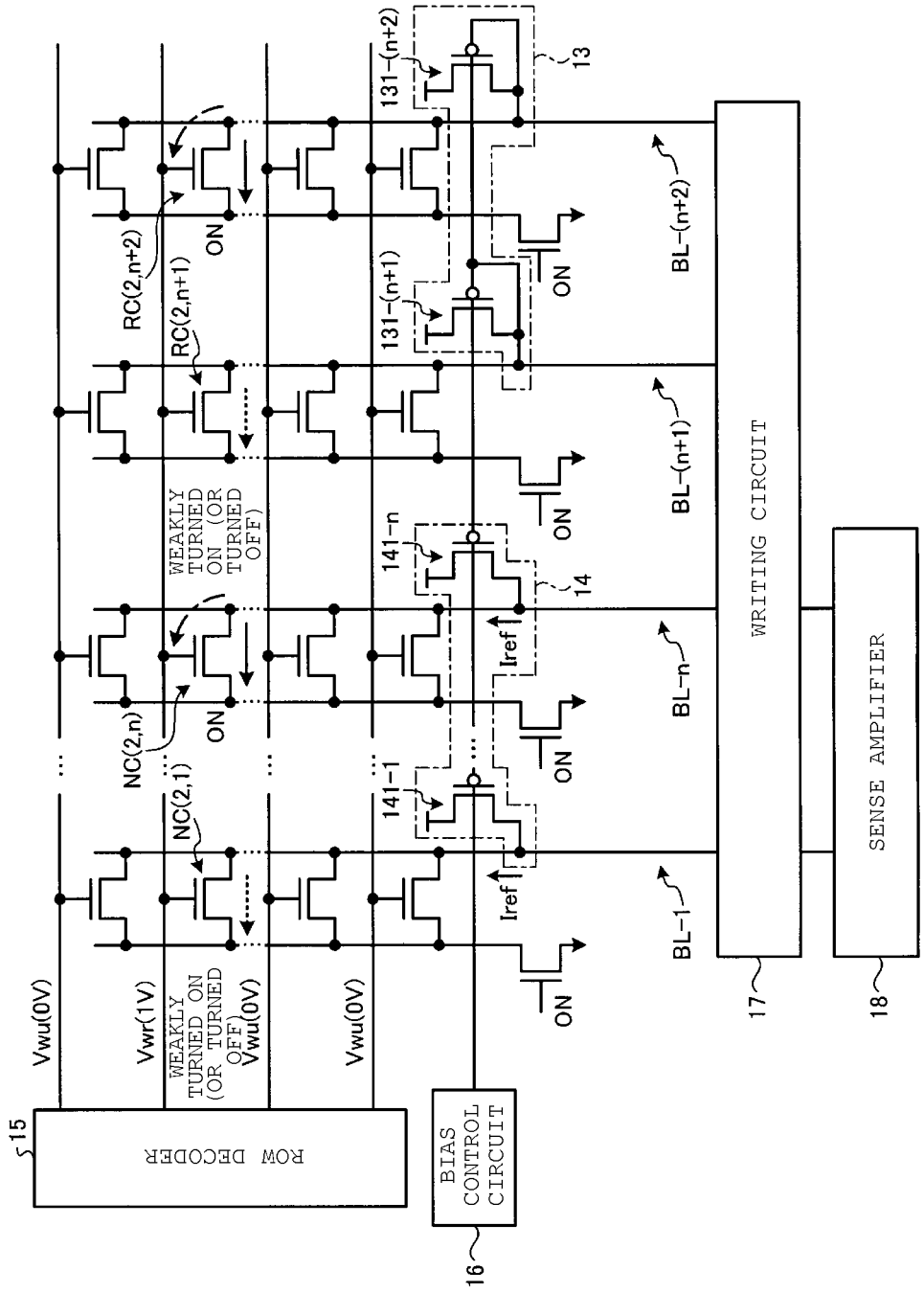
FIG. 5 is a circuit diagram illustrating a read-out operation from a normal cell in the embodiment.

Next, a read-out operation from the normal cell NC in the OTP circuit 10 is described with reference to FIG. 5. FIG. 5 is a circuit diagram illustrating a read-out operation from the normal cell NC.

In the read-out operation from the normal cell NC, the bias control circuit 16 turns on the current source transistors 141-1 to 141-n and the bias transistors 131-(n+1) and 131-(n+2) as illustrated in FIG. 5. The bias generation circuit 13 generates a bias based on a current flowing through a bit line BL-(n+1) and a current flowing through a bit line BL-(n+2). The current generation circuit 14 generates a reference current Iref based on the bias generated by the bias generation circuit 13 and supplies the reference current to each of the bit lines BL-1 to BL-n. In addition, the writing circuit 17 connects the bit lines BL-1 to BL-n and the corresponding connection lines CL-1 to CL-n, and turns on the current sources 19-1 to 19-(n+2). The result is that the potentials of the source lines SL-1 to SL-(n+2) are pulled to a ground potential. To confirm whether a "1" bit is properly programmed in the normal cell NC(2,1) in the second row and first column by performing a read-out operation, the row decoder 15 applies a read-out voltage Vwr (for example, 1 V) to a word line WL-2 in the selection row (second row), and applies a non-selection voltage Vwu (for example, 0 V) to word lines WL-1 and WL-3 to WL-m of non-selection rows (first and third to m-th rows). In addition, the current generation circuit 14 supplies a reference current Iref to the bit lines BL-1 to BL-n.

In the selection row (second row), since the normal cell NC(2,1), which was targeted for programming, has a threshold voltage of approximately 0.7 V (+threshold variation), the normal cell is weakly turned on (or weakly turned off) due to the voltage difference between a read-out voltage Vwr (for example, 1 V) applied to a control terminal G and a reference terminal S pulled to ground potential (0 V). In the normal cell NC(2,1), a region between the reference terminal S and the input-output terminal D may be regarded as being in a high resistance state (see a dotted line arrow of FIG. 5) where a reference current Iref is not likely to flow.

In the selection row (second row), since normal cells NC(2,2) to NC(2,n), which were not targets for programming, have a threshold voltage of approximately 0.5 V (+threshold variation), the normal cells are turned on due to a voltage difference between a read-out voltage Vwr (for example, 1 V) applied to a control terminal G and a reference terminal S pulled to ground potential (0 V). In the normal cells NC(2,2) to NC(2,n) which were not targets for programming, a region between the reference terminal S and the input-output terminal D may be regarded as being in a low resistance state (see a solid line arrow of FIG. 5) in which a reference current Iref easily flows.

At this time, since a replica cell RC(2,n+1) has a threshold voltage of approximately 0.7 V (+threshold variation), the replica cell is weakly turned on (or weakly turned off) due to a voltage difference between a read-out voltage Vwr (for example, 1 V) applied to a control terminal G and a reference terminal S pulled to ground potential (0 V). In the normal cell NC(2,1), a region between the reference terminal S and the input-output terminal D may be regarded as being in a high resistance state (see the dotted line arrow of FIG. 5) in which a reference current Iref is not likely to flow. That is, the replica cell RC(2,n+1) replicates threshold characteristics (characteristics of a program cell) of the normal cell NC(2,1, and supplies a current based on the replicated threshold characteristics to the bias generation circuit 13.

Since a replica cell RC(2,n+2) has a threshold voltage of approximately 0.5 V (+threshold variation), the replica cell is turned on due to a voltage difference between a read-out voltage Vwr (for example, 1 V) applied to a control terminal G and a reference terminal S pulled to ground potential (0 V). In the replica cell RC(2,$n$+2), a region between the reference terminal S and the input-output terminal D may be regarded as being in a low resistance state (see the solid line arrow of FIG. 5) in which a reference current Iref easily flows. That is, the replica cell RC(2,$n$+2) replicates threshold characteristics (characteristics of a non-program cell) of the normal cells NC(2,2) to NC(2,$n$) which were not targets for programming, and may supply a current based on the replicated threshold characteristics to the bias generation circuit 13.

In the selection row (second row), when a read-out operation from the normal cell NC(2,1), there is a possibility that a read disturbance can occur (see a dashed line arrow of FIG. 5) where the normal cells NC(2,2) to NC(2,$n$) which were not targets for programming are programmed due to a small voltage difference between the control terminal G and the input-output terminal D. When the read disturbance occurs, threshold characteristics of the normal cells NC(2,2) to NC(2,$n$) can vary.

In the replica cell RC(2,$n$+2) replicating characteristics of a non-program cell in the selection row (second row), there is a possibility that read disturbance can occur (see the dashed line arrow of FIG. 5) where the replica cell is programmed due to a small voltage difference between the control terminal G and the input-output terminal D. That is, the replica cell RC(2,$n$+2) replicates the read disturbance of the normal cells NC(2,2) to NC(2,$n$) in the selection row (second row).

Figure 6:
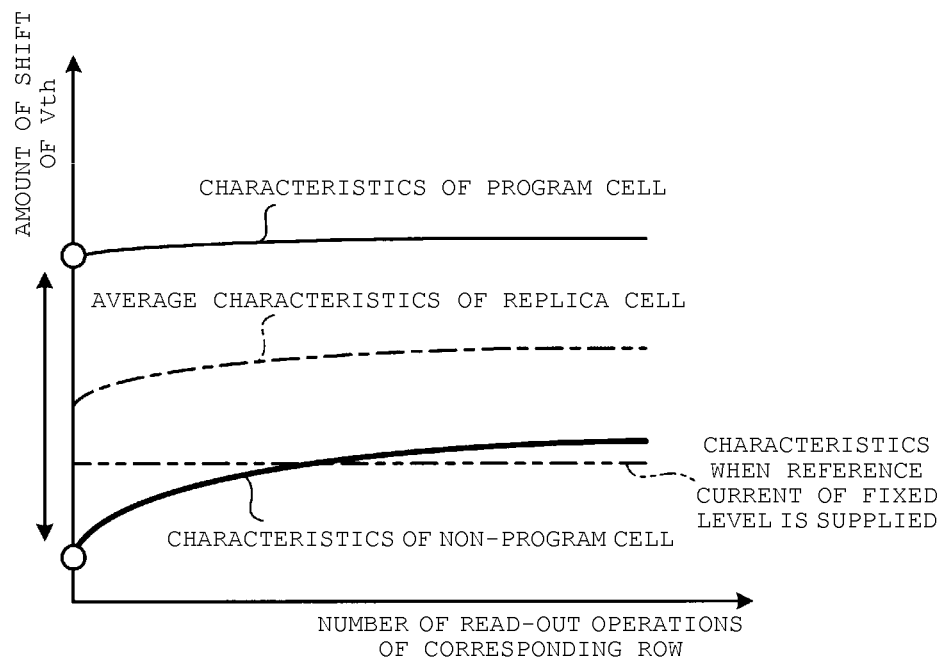
FIG. 6 is a diagram illustrating average characteristics of a replica cell following read disturbance in the embodiment.
Figure 7:
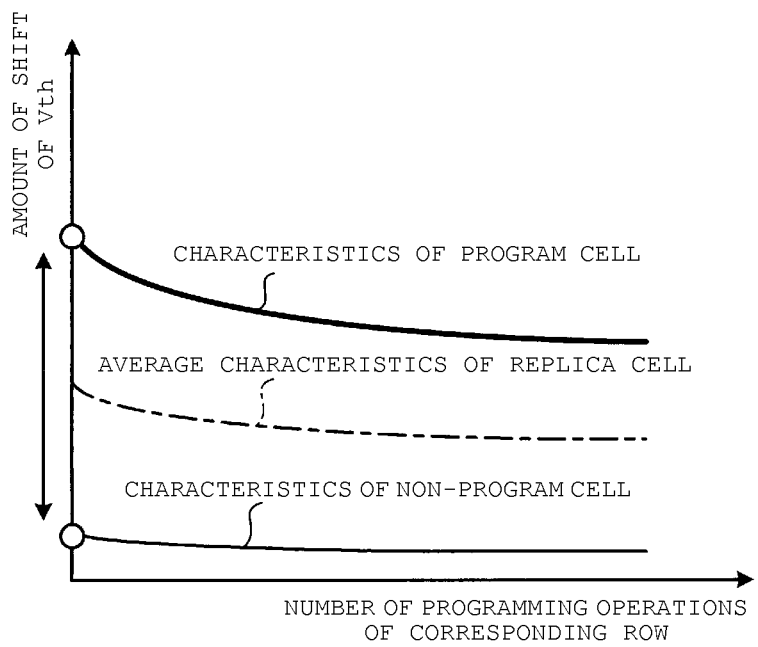
FIG. 7 is a diagram illustrating average characteristics of a replica cell following program disturbance in the embodiment.
Figure 8:
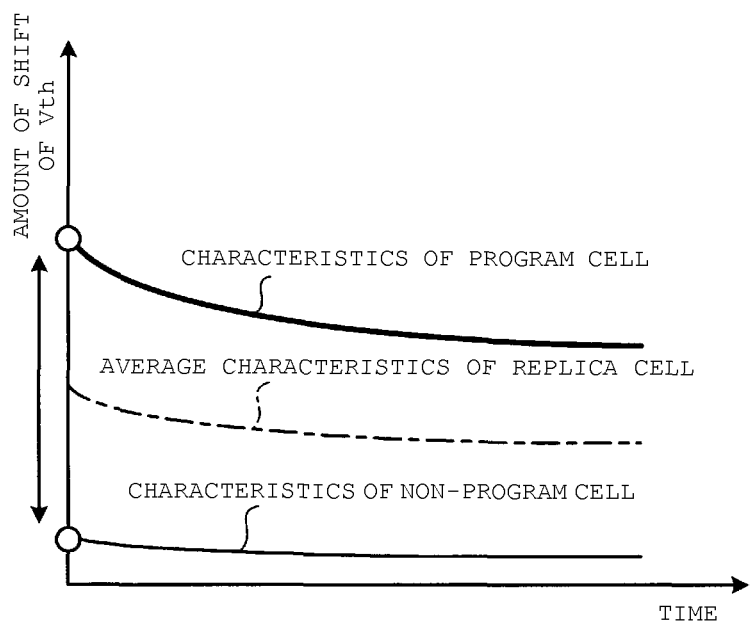
FIG. 8 is a diagram illustrating average characteristics of a replica cell following a change over time in the embodiment.

The bias generation circuit 13 receives a current based on characteristics of a program cell and a current based on characteristic of a non-program cell and generates a bias which provides a reference current based on characteristics (average characteristics of a replica cell) which are obtained by averaging both of the currents (see FIGS. 6 to 8). Thus, even when the characteristics of the program cell and the characteristics of the non-program cell vary, the current generation circuit 14 generates a reference current Iref which is equivalent to that derived from a cell having intermediate characteristics, i.e., characteristics between the characteristics of the program cell and the characteristics of the non-program cell. The current generation circuit 14 supplies the generated reference current Iref to bit lines BL-1 to BL-n.

Since the normal cell NC(2,1), which was the target for programming, is in a high resistance state during a read-out operation, the bit line BL-1 is easily charged by the reference current Iref, which results in an increase in the potential thereof. On the other hand, since the normal cells NC(2,2) to NC(2,$n$) which were not targets for programming are in a low resistance state, the bit lines BL-2 to BL-n are not charged with the reference current Iref, which results in a tendency for the potentials thereof to be lowered.

The sense amplifier 18 detects potentials of the respective bit lines BL-1 to BL-n, and supplies a detection result to an external controller (not shown) which compares the detected potentials of the respective bit lines BL-1 to BL-n and a reference potential. When the potential of the bit line BL-1 is equal to or higher than the reference potential, it is possible to inspect that data is properly programmed in the normal cell NC(2,1) which was a target for programming.

At this time, the reference current Iref is a current equivalent to that derived from a cell having intermediate characteristics, i.e., characteristics between characteristics of a program cell and characteristics of a non-program cell. Thus, even when the characteristics of the program cell and the characteristics of the non-program cell vary, the potentials of the respective bit lines BL-2 to BL-n are not likely to be influenced by the variations in the characteristics. Thus, even when the characteristics of the program cell and the characteristics of the non-program cell vary, it is possible to inspect that data is properly programmed in the normal cell NC(2,1), which was a target for programming, while suppressing the influence of the variations.

Next, a description is given of a point at which reference current Iref is generated, by assuming three ideal cases illustrated in FIGS. 6 to 8. FIG. 6 is a diagram illustrating average characteristics of a replica cell following read disturbance. FIG. 7 is a diagram illustrating average characteristics of a replica cell following program disturbance. FIG. 8 is a diagram illustrating average characteristics of a replica cell following a change over time. Meanwhile, characteristics of a program cell and characteristics of a non-program cell are a mixture of the three ideal cases illustrated in FIGS. 6 to 8.

When threshold characteristics of a normal cell vary due to read disturbance, characteristics of a program cell vary little, if at all, with the number of read-out operations of the corresponding row as illustrated in FIG. 6, while characteristics of a non-program cell vary in a way that approaches the characteristics of the program cell.

If a reference current of a fixed level is supplied to bit lines BL-1 to BL-n, characteristics equivalent to a cell having the reference current become characteristics as shown by a two-dot chain line in FIG. 6. In this case, since an upper and lower relation of the characteristics equivalent to a cell having the reference current to the characteristics of the non-program cell is reversed with respect to the number of read-out operations of the corresponding row, there is a tendency for a non-program cell, originally determined to be in a non-program state, to be erroneously determined to be in a program state. As shown by a solid line arrow in FIG. 6, there is the possibility of this tendency becoming remarkable when initial characteristics of the program cell and the non-program cell vary according to conditions (temperature, voltage, and the like) during programming.

On the other hand, in the embodiment, as shown by a dashed line in FIG. 6, the bias generation circuit 13 generates a bias based on average characteristics of a replica cell which are equivalent to intermediate characteristics, i.e., characteristics between the characteristics of the program cell and the characteristics of the non-program cell, and supplies the generated bias to the current generation circuit 14. Thus, even when the characteristics of the program cell and the characteristics of the non-program cell vary, the current generation circuit 14 generates a reference current Iref equivalent to that derived from a cell having intermediate characteristics. In addition, even when initial characteristics of the program cell and the non-program cell vary according to conditions (temperature, voltage, and the like) during programming, it is possible to generate a reference current Iref equivalent to that derived from a cell having intermediate characteristics. The current generation circuit 14 supplies the generated reference current Iref to the bit lines BL-1 to BL-n.

When threshold characteristics of a normal cell vary due to program disturbance, characteristics of a non-program cell vary little, if at all, with respect to the number of programming operations of the corresponding row as illustrated in FIG. 7, while characteristics of a program cell vary in a way that approaches the characteristics of the non-program cell.

On the other hand, in the embodiment, as shown by a dashed line in FIG. 7, the bias generation circuit 13 generates a bias based on average characteristics of a replica cell which are equivalent to intermediate characteristics, i.e., characteristics between characteristics of a program cell and characteristics of a non-program cell, and supplies the bias to the current generation circuit 14. Thus, even when the characteristics of the program cell and the characteristics of the non-program cell vary, the current generation circuit 14 generates a reference current Iref equivalent to that derived from a cell having intermediate characteristics. The current generation circuit 14 supplies the generated reference current Iref to bit lines BL-1 to BL-n.

When threshold characteristics of a normal cell vary due to a change over time, characteristics of a non-program cell vary little with time as illustrated in FIG. 8, while characteristics of a program cell vary in a way that approaches the characteristics of the non-program cell. That is, there is a tendency for electrons accumulated in a gate oxide film of the program cell to escape from the gate oxide film with time due to deterioration of the gate oxide film, and the like.

On the other hand, in the embodiment, as shown by a dashed line in FIG. 8, the bias generation circuit 13 generates a bias based on average characteristics of a replica cell which are equivalent to intermediate characteristics, i.e., characteristics between characteristics of a program cell and characteristics of a non-program cell, and supplies the generated bias to the current generation circuit 14. Thus, even when the characteristics of the program cell and the characteristics of the non-program vary, the current generation circuit 14 may generate a reference current Iref equivalent to that derived from a cell having intermediate characteristics. The current generation circuit 14 supplies the generated reference current Iref to bit lines BL-1 to BL-n.

As described above, in the embodiment, the bias generation circuit 13 generates a bias based on a current flowing through a bit line BL-(n+1) and a current flowing through a bit line BL-(n+2) during a read-out operation. Thus, it is possible to generate a bias equivalent to a reference current obtained by averaging a current of a replica cell replicating a program cell and a current of a replica cell replicating a non-program cell. The current generation circuit 14 generates a current based on the bias generated by the bias generation circuit 13 and supplies the generated bias to the bit lines BL-1 to BL-n. Thus, even when characteristic of the program cell and characteristics of the non-program cell vary, the current generation circuit 14 generates a reference current Iref equivalent to that derived from a cell having intermediate characteristics. As a result, since the success or failure of programming to a normal cell is determined with respect to variations of the characteristics of the program cell and the characteristics of the non-program cell, it is possible to inspect the programming of a memory cell without performing loop processing. Therefore, it is possible to easily reduce an inspection time for the memory cell regarding whether or not the programming is being properly performed.

In the case when loop processing is performed, it is necessary to additionally mount a verification circuit for performing a verifying operation on the OTP circuit 10, but it is likely that the verification circuit has an area several times the area of the OTP circuit 10. For this reason, when the memory cell is inspected through the loop processing, a chip area of the semiconductor device 1 is remarkably increased, which results in a possibility of manufacturing costs of the semiconductor device 1 being remarkably increased.

On the other hand, in the embodiment, since the programming of a memory cell can be inspected without performing loop processing, it is not necessary to additionally mount a verification circuit on the OTP circuit 10. In addition, since a replica cell array to be added has an area equivalent to replica cells of, for example, m rows by two columns, only a slight increase in the area is required. Thus, it is possible to suppress an increase in the chip area of the semiconductor device 1 and to suppress an increase in the manufacturing cost of the semiconductor device 1.

In the above-described embodiment, a case where binary data is stored in each normal cell is described, but multi-value data can be stored in each normal cell. For example, as illustrated in FIG. 4, when a voltage difference between a control terminal G and an input-output terminal N is 7 V, a threshold voltage of a normal cell NC changes little while maintaining approximately 0.5 V in the case of time PT1, which is a short programming time, and the threshold voltage of the normal cell NC changes from approximately 0.5 V to approximately 0.57 V in the case of time PT2, which is a long programming time.

For example, with regard to the normal cell NC, bits "00" are regarded as being programmed (being set to be in a non-program state) when a threshold voltage is approximately 0.5 V, bits "01" are regarded as being programmed when a threshold voltage is approximately 0.57 V, and bits "10" are regarded as being programmed when a threshold voltage is approximately 0.7 V.

Figure 9:
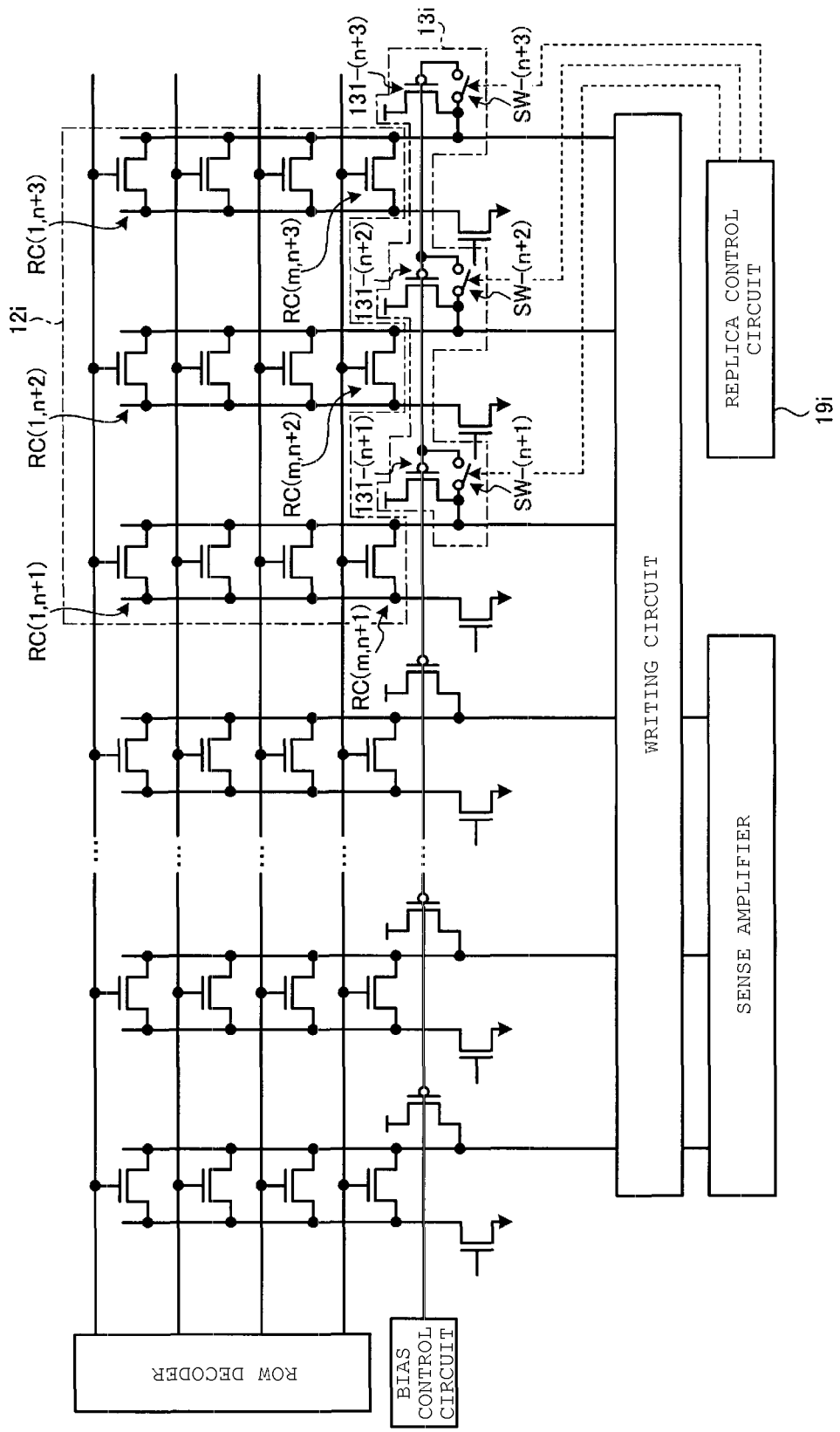
FIG. 9 is a diagram illustrating the configuration of an OTP circuit according to a modification example of the embodiment.

Accordingly, as illustrated in FIG. 9, in a replica cell array 12$i$, it is possible to add replica cells RC(1,$n$+3) to RC(m,n+3) that replicate program cells of bits "01", in addition to replica cells RC(1,$n$+1) to RC(m,n+1) that replicate program cells of bits "10" and replica cells RC(1,$n$+2) to RC(m,n+2) that replicate non-program cells.

In addition, the bias generation circuit 13$i$ may further include a bias transistor 131-($n$+3) and switches SW-(n+1) to SW-(n+3). The turn-on and turn-off of the switches SW-(n+1) to SW-(n+3) are controlled by a replica control circuit 19$i$. The plurality of switches SW-(n+1) to SW-(n+3) correspond to the plurality of bias transistors 131-($n$+1) to 131-($n$+3), respectively. The switches SW-(n+1) to SW-(n+3) activate the corresponding bias transistors 131 by being turned on, and deactivate the corresponding bias transistors 131 by being turned off. The bias transistors 131-($n$+1) to 131-($n$+3) form a current mirror circuit with the respective current source transistors 141-1 to 141-$n$, when being activated by the corresponding switches SW.

The replica control circuit 19$i$ selects a switch SW to be turned on, in accordance with which threshold value is desired to be determined by an external controller. For example, when the external controller is desired to perform determination of whether being a non-program state of bits "00" or a program state of bits "01", the replica control circuit 19$i$ turns off the switch SW-(n+1) and turns on the switches SW-(n+2) and SW-(n+3). For example, when the external controller is desired to perform determination of whether being a program state of bits "01" or a program state of bits "10", the replica control circuit 19$i$ turns off the switch SW-(n+2) and turns on the switches SW-(n+1) and SW-(n+3).

As a result, since the successor failure of programming to a normal cell may be determined in compliance with variations in characteristics of a program cell of bits "10", characteristics of a program cell of bits "01", and characteristics of a non-program cell, it is possible to inspect the programming of a memory cell without performing loop processing. Therefore, when multi-value data is programmed in the memory cell (normal cell), it is possible to easily reduce an inspection time for the memory cell regarding whether or not the programming is being properly performed.

Figure 10:
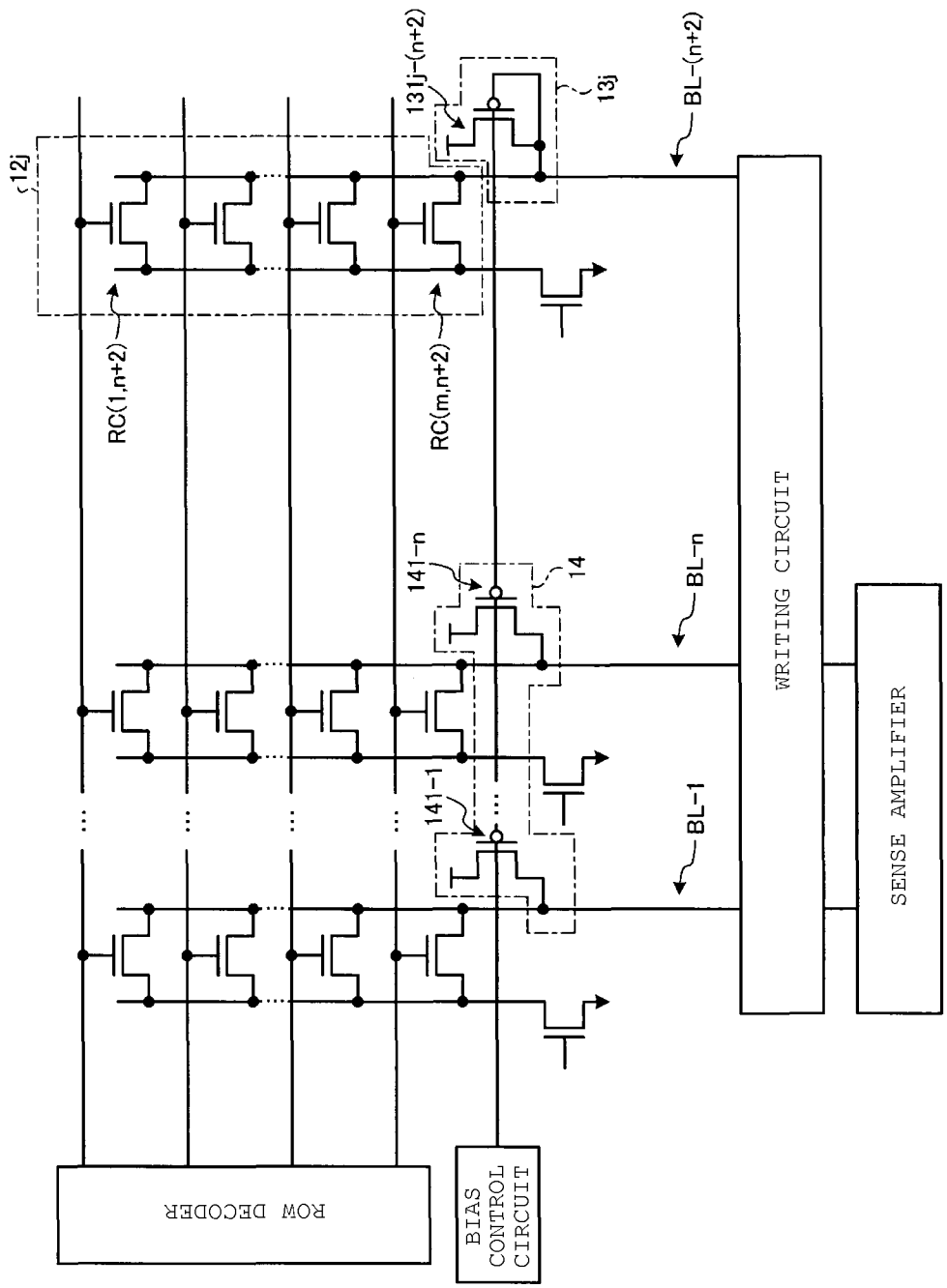
FIG. 10 is a diagram illustrating the configuration of an OTP circuit according to another modification example of the embodiment.

Alternatively, as illustrated in FIG. 10, in a replica cell array 12$j$, either characteristics of a program cell or characteristics of a non-program cell can be replicated. For example, it is considered that the OTP circuit 10 often receives read disturbance after the shipment of the semiconductor device 1 because a read-out operation is mainly performed. For this reason, as illustrated in FIG. 6, it is considered that the replication of the characteristics of the non-program cell, which vary significantly, allows a reference current Iref, which is equivalent to that derived from a cell having intermediate characteristics following variations in the characteristics of the program cell and the characteristics of the non-program cell, to be generated. For this reason, the replica cell array 12j is configured such that replica cells RC(1,n+1) to RC(m,n+1) that replicate a program cell are omitted from the replica cell array 12 (see FIG. 2).

Figure 11:
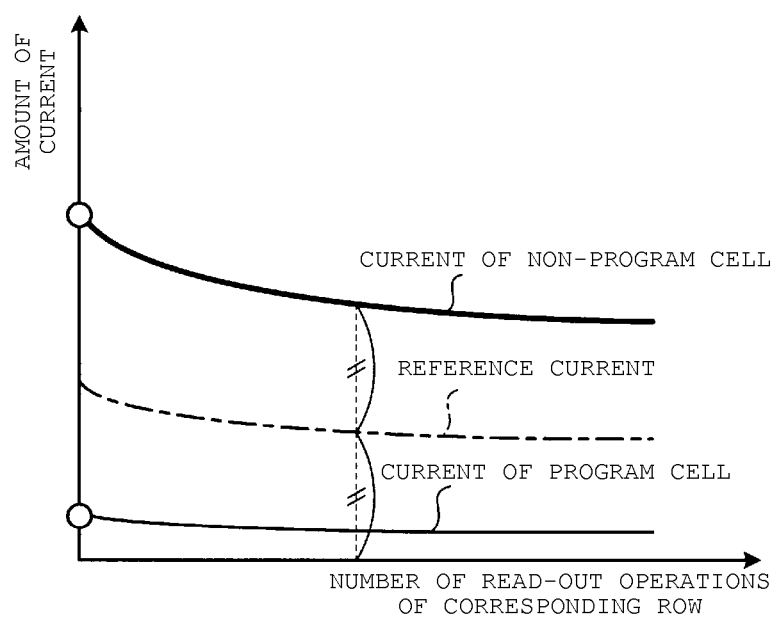
FIG. 11 is a diagram illustrating a reference current which is generated in compliance with read disturbance in another modification example of the embodiment.

In addition, in order to create intermediate characteristics following the characteristics of the program cell and the characteristics of the non-program cell, the configuration of a bias generation circuit 13j is designed accordingly. The bias generation circuit 13j is configured such that a bias transistor 131-(n+1) is omitted from the bias generation circuit 13 (see FIG. 2), and includes a bias transistor 131j-(n+2) instead of a bias transistor 131-(n+2). The bias transistor 131j-(n+2) is configured to have a dimension which is smaller than the dimension of the current source transistors 141-1 to 141-n. For example, when the bias transistor 131j-(n+2) has a dimension which is substantially half the dimension of the current source transistors 141-1 to 141-n, a mirror ratio therebetween is substantially 1/2. In this case, as illustrated in FIG. 11, a reference current having a size which is substantially half the size of a current received in the bias generation circuit 13j through the bit line BL-(n+2) is copied into the bit lines BL-1 to BL-n. That is, the current generation circuit 14 may generate a reference current Iref equivalent to that derived from a cell having intermediate characteristics, i.e., characteristics between the characteristics of the program cell and the characteristics of the non-program cell, and supply the generated reference current Iref to the bit lines BL-1 to BL-n.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a normal cell that is a one-time programmable (OTP) type memory cell;
   a replica cell that has characteristics equivalent to those of the normal cell;
   a word line that is electrically connected in common to a control terminal of the normal cell and a control terminal of the replica cell;
   a first bit line that is electrically connected to an input-output terminal of the replica cell;
   a bias generation circuit that is electrically connected to the first bit line;
   a second bit line that is electrically connected to an input-output terminal of the normal cell; and
   a current generation circuit that is connected to and the second bit line,
   wherein the bias generation circuit and the current generation circuit are controlled through a common control line.

2. The device according to claim 1, further comprising:
   a second replica cell that has characteristics equivalent to those of the normal cell and includes a control terminal electrically connected to the word line; and
   a third bit line that is electrically connected to an input-output terminal of the second replica cell,
   wherein the bias generation circuit is electrically connected to the first bit line and the third bit line.

3. The device according to claim 2, further comprising:
   a second normal cell that is an OTP type memory cell and includes a control terminal electrically connected to the word line; and
   a fourth bit line that is electrically connected to an input-output terminal of the second normal cell,
   wherein the current generation circuit is electrically connected to the bias generation circuit, the second bit line, and the fourth bit line.

4. The device according to claim 3, further comprising:
   a third normal cell that is an OTP type memory cell and includes an input-output terminal electrically connected to the second bit line;
   a third replica cell that has characteristics equivalent to those of the third normal cell and includes an input-output terminal electrically connected to the first bit line;
   a second word line that is electrically connected in common to a control terminal of the third normal cell and a control terminal of the third replica cell; and
   a decoder that is electrically connected to the word line and the second word line.

5. The device according to claim 3, further comprising:
   a writing circuit that is electrically connected to the first bit line, the second bit line, the third bit line, and the fourth bit line; and
   a sense amplifier that is capable of being electrically connected to the second bit line and the fourth bit line through the writing circuit.

6. A memory device comprising:
   an array of a normal cells for storing binary data, each normal cell having a word line and a bit line for accessing the normal cell, and a first set of physical characteristics;
   an array of replica cells for storing binary data, each replica cell having a word line and a bit line for accessing the replica cell, and a second set of physical characteristics, the second set of physical characteristics matching the first set of physical characteristics, wherein the array of replica cells includes at least two replica cells corresponding to each normal cell, and the at least two replica cells are each coupled to the same word line as the corresponding normal cell, at least one of the replica cells replicating a programmed cell;
   a bias generation circuit providing a bias current to the bit lines of each of the at least two replica cells in the array of replica cells, the bias current representing average characteristics of a programmed and non-programmed cell; and
   a current generation circuit providing a reference current to the bit lines of the normal cells in the array of normal cells based on the bias current.

7. The device according to claim 6, wherein the binary data is represented by a single bit.

8. The device according to claim 7, wherein the array of replica cells includes two columns of replica cells.

9. The device according to claim 6,
   wherein the bias current generator includes a first set of transistors and the current generation circuit includes a second set of transistors;

wherein each of the first set of transistors is diode-connected transistors and has a common gate that provides a bias voltage; and wherein a gate of each of the second set of transistors is electrically connected to the common gate of the gate of first set transistors to form a current mirror such that the current in the first set of transistors is mirrored into the second set of transistors.

10. The device according to claim 6, wherein each of the normal cells and each of the replica cells is a single transistor; and the physical characteristics include a channel width and a channel length of the transistors.

11. The device according to claim 6, further comprising:

a writing circuit that is electrically connected to the bit lines of the cells; and a sense amplifier that is electrically connected to the writing circuit to sense the bit lines of the normal cells during a read-out operation.

12. The device according to claim 6, wherein the normal cells and the replica cells are arranged in rows and columns, a word line corresponding to each row, the device further comprising a row decoder configured to activate one of the word lines to select a normal cell for reading or programming.

13. The device according to claim 6, wherein the binary data is represented by multiple bits.

14. The device according to claim 13, wherein values of the multiple bits are distinguished based on threshold voltage.

15. The device according to claim 13, wherein the array of replica cells includes a first, second, and third column of replica cells, the first column of replica cells replicating program cells in the normal array that contain a '10' bit value, the second column of replica cells replicating non-program cells in the normal array, and the third column of replica cells replicating program cells in the normal array that contain a '01' bit value.

16. The device according to claim 13, wherein the bias generation circuit includes first, second, and third transistors, each transistor having a drain and a gate, with the gates electrically connected to each other, the device further comprising first, second, and third switches, each switch respectively connected electrically between the gate and the drain of the first, second, and third transistors; and a replica control circuit for selectively activating or deactivating one or more of the first, second and third switches to set a threshold for reading the multi-bit binary data contained in the normal and replica cells.

17. A memory device comprising:

an array of a normal cells for storing binary data, each normal cell having a word line and a bit line for accessing the normal cell, and a first set of physical characteristics;

an array of replica cells for storing binary data, each replica cell having a word line and a bit line for accessing the replica cell, and a second set of physical characteristics, the second set of physical characteristics matching the first set of physical characteristics, wherein the array of replica cells includes a single replica cell corresponding to each normal cell, and the single replica cell has the same word line as the corresponding normal cell, the single replica cell replicating a non-programmed cell;

a bias current generator providing a bias current to the bit lines of each of the one or more replica cells in the array of replica cells, the bias current representing average characteristics of a programmed and non-programmed cell; and a current generation circuit providing a reference current to the bit lines of the normal cells in the array of normal cells based on the bias current.

18. The device according to claim 17, wherein the bias current generator includes a first transistor that sets a bias current and the current generation circuit includes a set of second transistors electrically connected to the first transistor to form a current mirror that mirrors the bias current from the first transistor to the set of second transistors.

19. The device according to claim 18, wherein the first transistor has a dimension that is smaller than a dimension of the second transistors.

20. The device according to claim 19, wherein the dimension of the first transistor is half that of the second transistors.

* * * * *